(12) United States Patent
Coiffic et al.

(10) Patent No.: US 8,562,934 B2
(45) Date of Patent: Oct. 22, 2013

(54) METHOD FOR FORMING POROUS MATERIAL IN MICROCAVITY OR MICROPASSAGE BY MECHANICOCHEMICAL POLISHING

(75) Inventors: Jean-Christophe Coiffic, Grenoble (FR); Maurice Rivoire, Meylan (FR)

(73) Assignees: Commissariat a l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 356 days.

(21) Appl. No.: 12/936,289

(22) PCT Filed: Mar. 30, 2009

(86) PCT No.: PCT/FR2009/000369
§ 371 (c)(1),
(2), (4) Date: Oct. 4, 2010

(87) PCT Pub. No.: WO2009/130416
PCT Pub. Date: Oct. 29, 2009

(65) Prior Publication Data
US 2011/0034329 A1    Feb. 10, 2011

(30) Foreign Application Priority Data
Apr. 8, 2008  (FR) ...................... 08 01921

(51) Int. Cl.
*D01F 9/12*   (2006.01)
*B01J 23/00*  (2006.01)
*B01J 23/70*  (2006.01)
*B01J 23/04*  (2006.01)

(52) U.S. Cl.
USPC ........ 423/447.1; 502/100; 502/338; 502/325; 502/337; 502/344; 423/447.2

(58) Field of Classification Search
None
See application file for complete search history.

(56) References Cited

U.S. PATENT DOCUMENTS

| 6,129,901 A | 10/2000 | Moskovits et al. |
| 6,429,098 B1 * | 8/2002 | Bensahel et al. ............. 438/478 |
| 2002/0137260 A1 | 9/2002 | Leung et al. |
| 2004/0002207 A1 | 1/2004 | Yu |
| 2004/0259480 A1 * | 12/2004 | Hung et al. .................... 451/41 |

(Continued)

FOREIGN PATENT DOCUMENTS

| KR | 10-2004-0005075 |   | 1/2004 |
| KR | 10-2004-0005075 | * | 7/2004 |

OTHER PUBLICATIONS

Katok et al. "Catalytic Synthesis of Carbon Nanotubes Over Ordered Mesoporous Matrices", Journal of Thermal Analysis and Calorimetry, vol. 86 (2006) 1, 109-114.*

(Continued)

*Primary Examiner* — Bijay Saha
(74) *Attorney, Agent, or Firm* — Oliff & Berridge, PLC (57) ABSTRACT

A surface of a substrate comprising microcavities leading out of the substrate is placed in contact with an aqueous solution comprising a plurality of suspended particles and a fabric. Perpendicular pressure is applied the expanse of the substrate between the fabric and the surface of the substrate, and relative movement of the fabric and the surface is applied to the expanse of the substrate. At least one particle is thus fed into each microcavity, therein forming a porous material that is a catalyst material for nanothread or nanotube growth.

11 Claims, 8 Drawing Sheets

(56) References Cited

U.S. PATENT DOCUMENTS

| | | |
|---|---|---|
| 2006/0134329 A1 | 6/2006 | Wei et al. |
| 2006/0208362 A1 | 9/2006 | Dubin |
| 2006/0264039 A1 | 11/2006 | Cohen |
| 2008/0157075 A1* | 7/2008 | Feustel et al. .................. 257/48 |
| 2008/0220610 A1* | 9/2008 | Bayer et al. .................. 438/693 |

OTHER PUBLICATIONS

Katok et al., "Catalytic Synthesis of Carbon Nanotubes Over Ordered Mesoporous Matrices," *Journal of Thermal Analysis and Calorimetry*, vol. 86, 2006, pp. 109-114.

Kim at al., "Crossflow membrane filtration of interacting nanoparticle suspensions," *Journal of Membrance Science*, vol. 284, 2006, pp. 361-372.

Peyrade et al., "Direct observation and localization of colloidal nanoparticles on patterned surface by capillary forces," *Microelectronic Engineering*, vol. 83, 2006, pp. 1521-1525.

Xie et al., "Effects of particle size, polishing pad and contact pressure in free abrasive polishing," *WEAR*, vol. 200, 1996, pp. 281-295.

Merritt et al., "High performance nanoporous carbon membranes for air separation," *CARBON*, vol. 45, 2007, pp. 1267-1278.

International Search Report dated May 26, 2010 in International Patent Application No. PCT/FR2009/000369 (with translation).

* cited by examiner

METHOD FOR FORMING POROUS MATERIAL IN MICROCAVITY OR MICROPASSAGE BY MECHANICOCHEMICAL POLISHING

BACKGROUND OF THE INVENTION

The invention relates to a method for forming porous material in at least one microcavity or micropassage of a support, said microcavity or said micro-passage opening out onto a surface of the support.

STATE OF THE ART

Continuous improvement of the performances of integrated circuits, for example in terms of consumption or operating frequency, is ineluctably leading to a constant reduction of the size of its components. Continuous reduction of the size of transistors has been made possible by the use of new materials, for example low-K and ultra low-K materials, which present a lower dielectric constant than that of silicon oxide.

These low-K materials are typically used in electrical insulation of components in the form of patterns integrated in the substrate or in the interconnect structures of integrated circuits to insulate the metallic material lines and reduce their electromagnetic coupling.

In conventional manner, a void having the lowest dielectric constant, a low-K material is obtained by creating porosity in a dielectric material, i.e. by incorporating a void or a gas in the material. By maximizing the porosity in the insulating material, it is thus possible to greatly reduce the dielectric constant of the final material. Typically, carbonaceous silicon oxide SiOC in bulk state has a dielectric constant equal to 3.2. For a porous SiOC material containing 26% of porosity with pores with a diameter of about 1 nm, for example BD2X® marketed by Applied Materials®, the dielectric constant is equal to 2.5.

Porous materials are typically obtained by plasma enhanced chemical vapor deposition or by spin coating. These techniques cannot however fill micro-cavities of small size, which makes these techniques unsuitable.

In parallel, particle depositions forming a porous material have been performed in small microcavities with techniques referred to as capillarity or sedimentation techniques, but these techniques are not suitable for an industrial approach. Such techniques have in particular been described by Peyrade et al. "Direct observation and localisation of colloidal nanoparticles on patterned surface by capillary forces", Microelectronic Engineering 83 (2006) 1521-1525.

OBJECT OF THE INVENTION

The object of the invention is to form a porous material in a microcavity in industrial and easy manner.

The method according to the invention is characterized by the appended claims and more particularly by the fact that, said surface being in contact with an aqueous solution comprising a plurality of particles in suspension, the method simultaneously comprises application of a pressure perpendicular to the plane of the support, between a pad and a surface of the support comprising the microcavity or micropassage, and a relative movement of the pad and of the surface in a direction parallel to the plane of the support to insert at least one particle in each microcavity or micro-passage, and that the porous material is a catalyst material for growth of nanowires or nanotubes.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
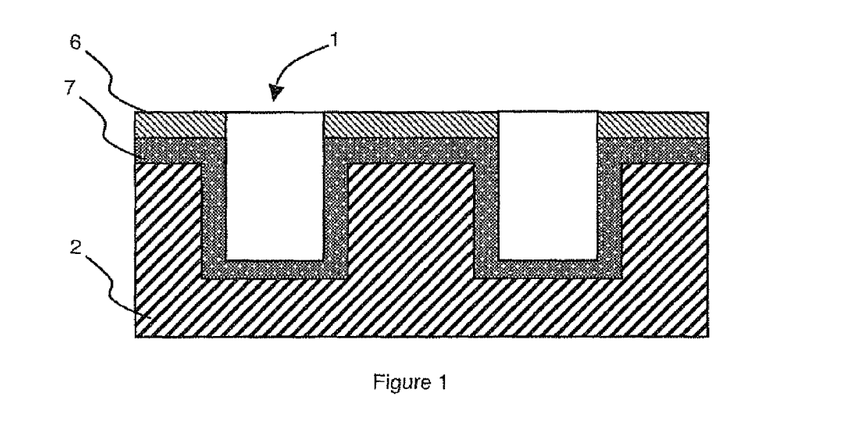
FIGS. 1 to 3 schematically represent the successive steps of the fabrication method according to the invention, in cross-section, FIGS. 4 and 5 schematically represent the successive steps of an alternative embodiment of the fabrication method according to the invention, in cross-section, FIGS. 6 and 7 schematically represent the successive steps of a second alternative embodiment of the fabrication method according to the invention, in cross-section, FIGS. 8 and 9 schematically represent the successive steps of a third alternative embodiment of the fabrication method according to the invention, in cross-section, FIGS. 10 to 12 schematically represent the successive steps of a fourth alternative embodiment of the fabrication method according to the invention, in cross-section, FIGS. 13 to 17 schematically represent, in cross-section, other variants of the fabrication method according to the invention illustrated in FIGS. 10 to 12.

As illustrated in FIG. 1, recesses, microcavities 1 are formed in a support 2 and open out onto one of the surfaces thereof, main surface 2a. Support 2 can be formed by a substrate, for example a silicon substrate. A plurality of layers can also be deposited on the substrate and form for example metallic interconnection levels. Microcavities 1 are formed in conventional manner, for example by photolithography and etching and can be produced directly in the substrate or in the layers deposited on the substrate.

Figure 2:
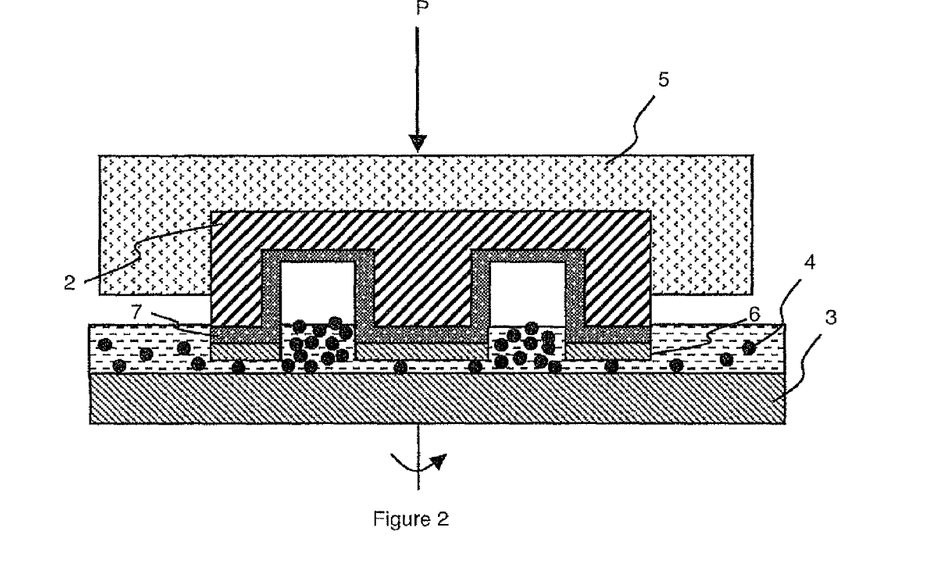

The surface of support 2 comprising microcavities 1 is then subjected to a chemical mechanical deposition process which is similar to chemical mechanical polishing processes. Thus, as illustrated in FIG. 2, the surface onto which microcavities 1 open out, main surface 2a, is placed in contact with a polishing pad 3, for example a piece of polyurethane, covered by an aqueous solution which contains particles 4. In conventional manner, a force is applied on the support in a direction forming a non-zero angle with respect to the plane of the support. This force results in creation of a pressure P between support 2 and pad 3, for example in a direction perpendicular to the plane of support 2. Support 2 further moves, for example by rotation, with respect to pad 3 or vice-versa. Movement advantageously takes place in a plane parallel to the plane of support 2. In general manner, chemical mechanical polishing is described by Xie et al. "Effects of particle size, polishing pad and contact pressure in free abrasive polishing", WEAR 200 (1996) 281-285.

Figure 3:
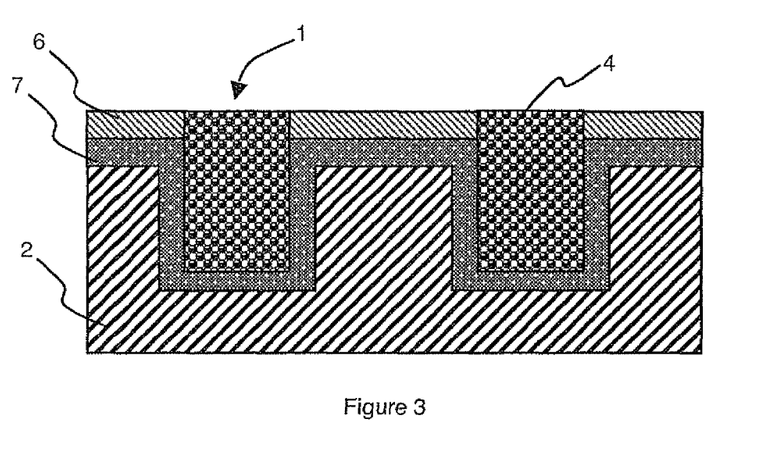

As illustrated in FIG. 3, when chemical mechanical deposition is performed, at least one particle 4 is introduced into each microcavity 1 which was initially void. A porous material is thereby formed inside the microcavity. It is constituted by the particle or particles and the void (or gas) which occupies the remaining volume of the microcavity. The porous material can completely or partially fill microcavity 1. The porous material can be formed by a single particle, but in conventional manner it is formed by a plurality of particles 4. The microcavity which is filled by the particle or particles then forms a pattern of porous material having dimensions that are defined by the initial dimensions of microcavity 1. Advantageously, these particles 4 are compressed in the microcavity to thereby form patterns of porous material which are mechanically stronger. Unlike chemical mechanical polishing, microcavities 1 are not filled by a material that has to be flattened, but are left void so that particles 4 contained in the aqueous solution are inserted into the microcavities.

Chemical mechanical deposition can be performed by conventional chemical mechanical polishing equipment, for example by equipment of Mirra or Reflexion type from Applied Materials® or by equipment of Megapol M550 type from Alpsitec or by equipment of Frex type from Ebara.

In the same way as for conventional chemical mechanical polishing, support 2 is securely attached to a mobile head 5, which enables a pressure P to be exerted between the surface of the support comprising microcavities 1 and pad 3 on which the support rests (FIG. 2). The load pressure exerted by the head on support 2 is comprised between 0.02 and 1 daN/cm². This load pressure enables particles 4 to be inserted in microcavities 1 and to be compressed. By modulating the value of the load pressure, it is possible to modulate the final porosity of the porous material, i.e. the void proportion in the final material.

Particles 4 being able to be compacted in microcavity 1, they then provide the edifice thus formed with a mechanical stability, which is particularly advantageous for forming vertical stacks, for example, in interconnection structures with air gaps.

Pads 3 used for chemical mechanical deposition are identical to those used in conventional polishing methods. In conventional manner, the characteristics of pad 3 depend on the desired application, on the materials located at the surface of the substrate and on the dimensions of the microcavities to be filled.

If the smallest dimension of microcavities 1 is larger than 10 μm, pads 3 called "flattening" pads, made from polyurethane, with a hardness classified as "shore D" comprised between 50 and 70, a density comprised between 60 and 90 mg/cm³ and a compressibility of less than 4% are used. Advantageously a IC1000™ commercial pad from Rohm & Haas is used.

If the smallest dimension of microcavities 1 is smaller than 10 μm, pads 3 called "medium" pads, with a hardness classified as "shore A" comprised between 50 and 70, a density comprised between 20 and 40 mg/cm³ and a compressibility comprised between 10 and 25% are used. Advantageously a Suba IVT™ commercial pad from Rohm & Haas is used.

If the dimensions of microcavities 1 are around a micron and/or if the surface of the support in contact with pad 3 comprises ductile materials which are liable to be scratched by particles, polishing pads 3 called "finishing" pads, with a hardness classified as "shore A" between 50 and 80, a density of less than 20 mg/cm³, and a compressibility greater than or equal to 30% are used. Advantageously a Politex™ commercial pad 3 from Rohm & Haas is used.

As in the case of chemical mechanical polishing, when deposition is performed, support 2 is in contact with an aqueous solution. Typically, the deposition uses an aqueous suspension of colloidal particles, either anionic or cationic, having a pH comprised between 1.5 and 12 to obtain a stable particle suspension. Adjustment of the pH enables the zeta potential which controls separation of particles 4 in the aqueous solution to be fixed.

Particles 4 in suspension in the aqueous solution can be pure or be made from a core material covered by a coating material. If particles 4 are pure, they are for example made from silica, carbon, cerium oxide, alumina, polymer material or from different metals, for example Fe, Co, Au, Pd, Ni, Pt, etc. If particles 4 are coated, the coating material is for example alumina, cerium oxide or iron oxide. They are for example particles of silica or of polymer materials or polymer compounds coated with alumina or with cerium oxide. The use of a coating material enables the zeta potential to be made to vary thereby enabling easy separation of the elementary particles of the colloidal suspension.

The size of elementary particles 4 is advantageously comprised between 3 and 300 nm. Furthermore, the weight percentage of particles 4 in the aqueous solution is advantageously comprised between 0.0001 and 50%. Particles 4 can be spherical or of any other shape.

For example purposes, the commercial aqueous solutions Klebosol™ 1508-35 and T605 can be used.

The Klebosol™ 1508-35 commercial aqueous solution is marketed by the Rohm & Haas and comprises 30% weight of silica particles having a diameter of 35 nm in an anionic solution with a pH of about 10 adjusted with $NH_4OH$. The T605 commercial aqueous solution is marketed by Hitachi Chemical and comprises 0.1% weight of silica particles having a diameter of 90 nm in an anionic solution with a pH of about 6.5.

Furthermore, chemical mechanical deposition is advantageously performed with an aqueous solution flow rate comprised between 5 and 300 ml/min for substrates varying between 1 and 450 mm. A relative speed of a point of the substrate with respect to a point of pad 3 is comprised between 0.1 and 0.3 m/s. In conventional manner, the deposition temperature is comprised between 2 and 70° C. The aqueous solution feed flow rate is adjusted to ensure renewal of the particles and to guarantee an excess of particles 4 in the pores of the polishing pad.

For example purposes, a load pressure of about 0.1 daN/cm2, a speed of 1 m/s, an aqueous solution flowrate of 150 ml/min for substrates with a diameter of 200 mm and a temperature of 52° C. are used to perform the chemical mechanical deposition. Under these conditions, particles 4 of silicon oxide having a mean diameter of about 35 nm are used with microcavities with a diameter of about 150 nm. The Klebosol™ 1508-35 aqueous solution is advantageously used.

In conventional manner, when chemical mechanical deposition is performed, polishing pad 3 only removes particles 4 from the aqueous solution on the parts in contact with the support, i.e. on the parts of support 2 bordering the microcavities and/or in the areas where the porous material overshoots the plane of the support.

However, when chemical mechanical deposition is performed, removal of material could take place on the top parts of the support, while the microcavities are being filled with the particles of the aqueous solution. Removal of material depends on the process conditions (load pressure, particle material, aqueous solution, and so on) and on the type of material present at the surface of the support.

If the material of support 2 that is in contact with pad 3 is too fragile, it can be eliminated in the course of the deposition process. A strengthening material 6 is then advantageously used (FIGS. 1 to 3). This strengthening material 6 is chosen such as to be resistant to the chemical mechanical process in order to reduce, or even totally eliminate, removal of material on the parts of the support which are in contact with pad 3 and aqueous solution. Strengthening layer 6 is formed on the surface and microcavities 1 are then etched in support 2 through the strengthening layer. The strengthening layer is for example made from silicon nitride.

In also advantageous manner, the inner walls of microcavities 1 are covered by a layer of covering material 7, for example by an insulating material for example silicon oxide. Although the wall of microcavity 1 is covered by layer 7, most of the volume of microcavity 1 is not filled.

If the material of support 2 is not chemically compatible with the material used for particles 4, these particles do not adhere to the surface of the material of the cavities and the particles are removed when rinsing with water at the end of polishing and/or when cleaning by brushing and drying of the wafer is performed. Layer 7 is therefore advantageously used according to the materials present and the desired applications. Layer 7 can serve the purpose of adhesion of the particles, but can also act as electrical insulation layer or as barrier layer against dopant diffusion or against formation of metal dendrites.

The pressure exerted by pad 3 on the particles located in the microcavities causes creation of bonds between the particles and also with the walls of the microcavities. When drying takes place, the particles remain chemically or electrostatically bonded to one another and to the microcavity walls. The pressure exerted on the particles can also give rise to sintering of the particles thereby enhancing the mechanical strength of the microcavity as a whole.

The number of particles 4 arranged in the microcavity 1 depends on the dimensions of microcavity 1, on the dimensions of particles 4 and on the pressure exerted on the particles. To obtain one particle per microcavity, it is advantageous to opt for a particle having substantially the same dimension as the microcavity. To obtain two particles per microcavity, it is advantageous to choose particles, assumed to be spherical, that have diameters substantially equal to two thirds of the dimension of the microcavity, assumed to be cubical. Thus, to arrange at least two spherical particles in a cavity, it is necessary for them to have a diameter that is smaller than two thirds of the smallest dimension of the microcavity.

Assuming microcavities 1 to be cubical and particles 4 to be spherical, the volume occupied by the particles cannot theoretically exceed 74% without compression. In crystallography, a compactness equal to 74% is obtained with stacks called "hexagonal closed-packed" or "closed-packed cubic face centered". The patterns of porous dielectric material thus have a minimum porosity of 26%. Practically, the actual compactness of such structures does not exceed 70%. There is therefore 30% porosity in the microcavities without compression. Furthermore, if the spherical particles have a diameter substantially equal to that of the microcavity, the cubical microcavity can only contain a single particle and the porosity reaches 50%. In this way, the porosity can therefore be modulated by controlling the size of the particles present in the microcavity. The number of particles present in the cavity can also be modulated even if the particles are not spherical.

The porous material can be a dielectric material and is then formed by particles 4 of dielectric material and/or covered by a dielectric material. The particles are for example made from silica, cerium oxide, alumina or polymer material if they are pure. The particles can however also be made from conducting material, for example carbon, iron, cobalt, platinum, nickel, etc covered by a dielectric material.

As illustrated in FIGS. 1 to 3, microcavities 1 can be formed in a silicon substrate and be filled with a porous dielectric material. In this way, porous dielectric material patterns electrically insulate active components. For example, the microcavities are filled with particles 4 of silicon oxide. In this configuration, layer 7 has a twofold function, it both performs electrical insulation of the microcavity and enhances adhesion of the particles. The substrate advantageously comprises silicon nitride strengthening layer 6, and layer 7 can be formed by oxidation or by deposition after formation of layer 6. When chemical mechanical deposition is performed, the particles are bonded to thin layer 7 covering the cavity. Bonding is performed chemically by forming SiOH bonds between the two SiO2 materials, particles 4 and layer 7, by the presence of water and the load pressure of the particles on layer 7. Bonding is also achieved mechanically by means of the load pressure which keeps particles 4 bonded in the microcavities. The particles are protected at the bottom of the microcavities from the movement of the pad on the surface of the sample. They are also protected from the mechanical action of movement of the pad by the very large number of particles which form a viscous protective film. The thickness of this protective film depends on the size and the concentration of the silica particles in the aqueous solution, on the material and the shape of the polishing pad, and on the pressure and speed parameters of the pad with respect to the substrate.

Figure 4:
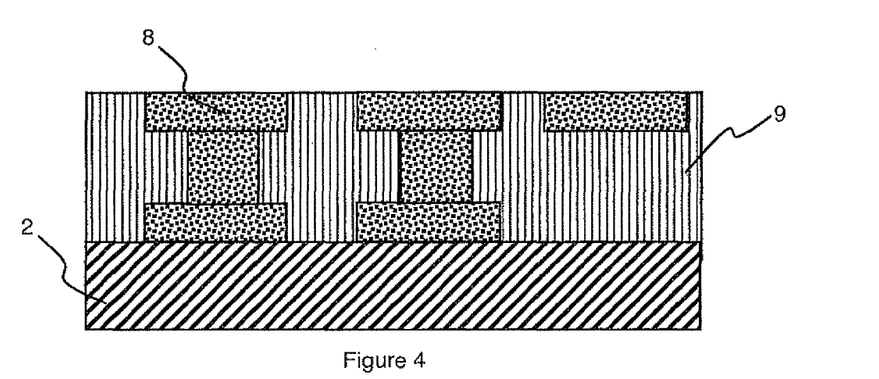
Figure 5:
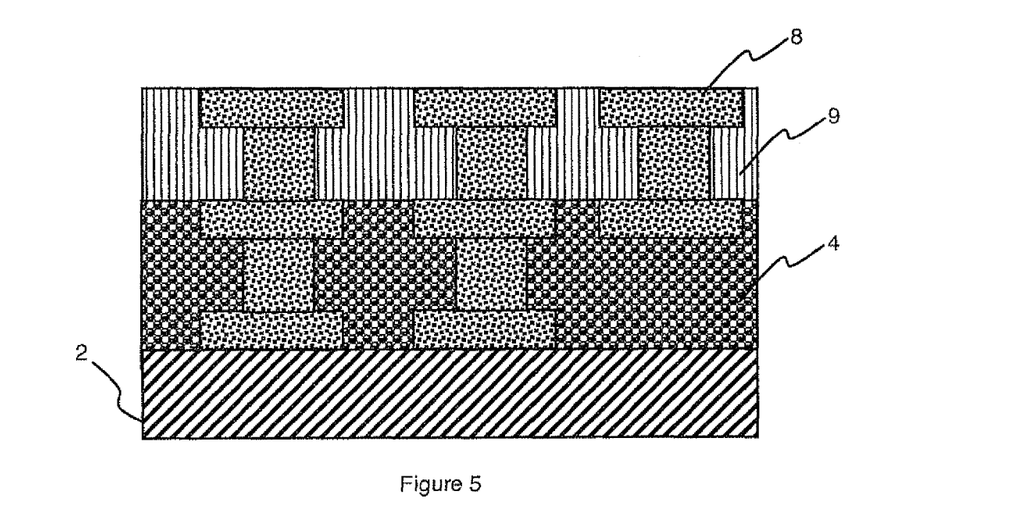

Microcavities 1 can also be made in a metallic interconnection structure of support 2, as illustrated in FIGS. 4 and 5. In conventional manner, as illustrated in FIG. 4, the metallic interconnection structure comprises metallic material patterns 8, for example made from copper or aluminium, that are separated by an insulating and/or sacrificial material 9, for example silica or SiOC which can also be porous. Insulating and/or sacrificial material 9, made from carbonaceous silica (SiOC), can for example be a silica of BD1® and BD2® type marketed by Applied Materials®. The metallic material patterns 8 coated with sacrificial and/or insulating material 9 are obtained in conventional manner by photolithography, etching, deposition and chemical mechanical polishing steps.

Microcavities 1 are then formed between metallic material patterns 8. Microcavities 1 can be formed in conventional manner in material 9, as illustrated in FIG. 1. Microcavities 1 are however preferably formed by at least partially removing insulating and/or sacrificial material 9. Removal is performed by any suitable technique, for example by means of hydrofluoric acid if the insulator is a silica. Sacrificial and/or insulating material 9 can thus be totally or partially eliminated according to the selected application.

Microcavities 1 are then filled, by chemical mechanical deposition, with a porous dielectric material constituted as before by particles 4. The layer of particles 4 that fills the microcavities is dense enough and solid enough to be able to form a new metallic interconnection level above the latter (FIG. 5).

In this configuration, material 9 conventionally being a porous material, layer 7 can be used as diffusion barrier layer for producing copper or aluminium interconnection structures. Layer 7, for example made from SiC, forms a diffusion barrier for the copper and a mechanical barrier against development of copper dendrites. The particles used are for example silica particles with or without carbonaceous dopants deposited in chemical mechanical manner between the metal lines to form the porous insulation. The porous insulating material conventionally has a dielectric constant of about 2 and a mechanical strength that enables formation of multiple interconnection levels.

The porous material formed in microcavities 1 can also be used as catalyst material to localize growth of nanotubes or nanowires. In this case, support 2 comprising microcavities 1 filled by the porous catalyst material is subjected to a nanotube or nanowire growth process. The nanowires or nanotubes can be electrically conductive or not.

Growth of silicon nanowires can be obtained from a porous catalyst material comprising gold particles 4. Furthermore, growth of carbon nanotubes is advantageously obtained from a porous catalyst material that comprises particles 4 of Fe, Ni and/or Co. However, the porous catalyst material can be any material suitable for growth of nanowires and/or nanotubes and in particular silicon oxide.

Typically, growth of the carbon nanotubes can be performed by any suitable technique, for example by chemical vapor deposition CVD, plasma enhanced chemical vapor deposition PECVD, Electron Cyclotron Resonance PECVD, hot-filament chemical vapor deposition, laser assisted chemical vapor deposition, etc. Preferably, a technique enabling growth of carbon nanotubes from the catalyst at a temperature of less than 900° C. is used. The gases used in formation of carbon nanotubes can be CO, $C_2H_2$, $CH_4$, $Fe(C_5H_5)_2$, xylene, metallocenes, alcohols in gaseous state and all carbonaceous gases, $H_2$, $NH_3$, $H_2O$, $O_2$ or a mixture of these gases. The carbon can also be input by means of a graphite sole bombarded by a plasma.

Figure 6:
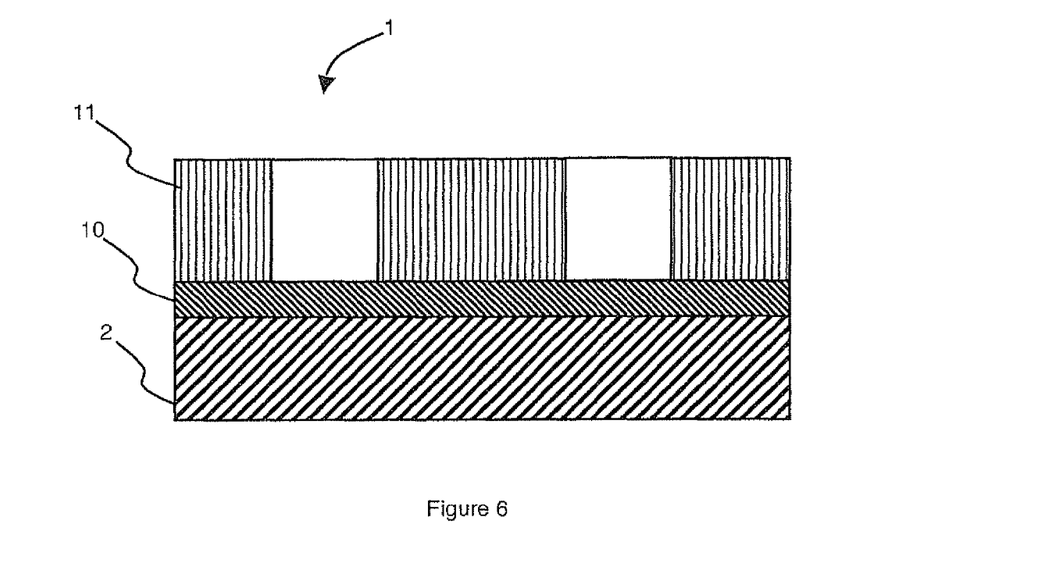
Figure 7:
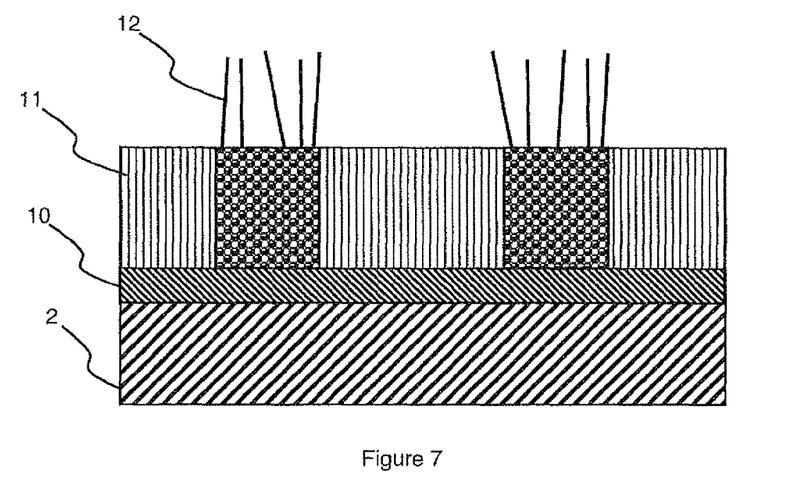

As illustrated in FIGS. 6 and 7, first 10 and second 11 materials are formed on support 2 and patterned so as to form microcavities 1. The bottom of microcavities 1 is then formed by first material 10 and the walls by second material 11. First and second materials 10 and 11 can be insulating or conducting materials. First and second materials 10 and 11 can be identical or different and are for example made from $Al_2O_3$, $SiO_2$, SiN, SiCN, SiC, SiOC or from polymer material. The porous catalyst material then fills the cavities and enables growth of nanotubes or nanowires 12. Advantageously, if the latter are electrically conductive, first material 10 is also conductive, for example made from Cu, Al, Fe, Co, Ni, Pd, Pt, W, Cr, TiN, TaN, Ta, Ti, Ru.

In an alternative embodiment, first and second materials 10 and 11 form parts of or form an interconnection structure. First material 10 is advantageously made from copper and forms patterns which are covered by second material 11, silicon oxide or a low-K material. Microcavities 1 are then formed in conventional manner in the silicon oxide above the copper patterns.

Advantageously, an adhesion layer and/or a barrier layer (not shown) is then deposited in the bottom of microcavities 1. The adhesion layer reinforces the adhesion of the barrier layer on the layer of first material 10. The adhesion layer is for example made from Ta, TaN, TiN, Ti, Al, Ru, Mn, Mo, Cr, and its thickness is advantageously less than 10 nm and can go down to deposition of an atomic layer. The barrier layer, generally used to prevent interdiffusion of the catalyst material with first material 10, is for example made from Al, TiN, Ti, Ta, TaN, CoWP, CoWB, NiMoP. The thickness of the barrier layer is typically less than 100 nm.

As before, the porous material is formed from particles 4 compacted in microcavities 1. During the growth process of nanotubes or nanowires 12, the latter grow vertically from particles 4. Depending on the porosity of the catalyst material, the density of nanotubes or nanowires 12 originating from the porous material pattern can vary. If an electric connection is to be made by means of nanotubes or nanowires, the porous catalyst material is also electrically conducting. Growth of the nanotubes or nanowires is achieved most of the time by growth called tip growth. The catalyst particle is permanently at the tip of the nanotube which rises as growth takes place. The nanotubes can thereby grow from the bottom of the cavity whatever the diameter of the pores.

In an alternative embodiment, microcavity 1 can be cleaned to eliminate residues contained in the aqueous solution and which were introduced with particles 4. The microcavities are then rinsed by means of a chemical solution which can be a mixture of water, hydrofluoric acid, sulphuric acid, hydrochloric acid and/or hydrogen peroxide. It is also possible to clean the cavity by means of heat treatment under oxygen at a temperature of more than 200° C., or to use a remote oxygen plasma. The nanotubes or nanowires can then be formed as previously. The microcavity cleaning technique is adapted to the material that composes the porous material.

Figure 8:
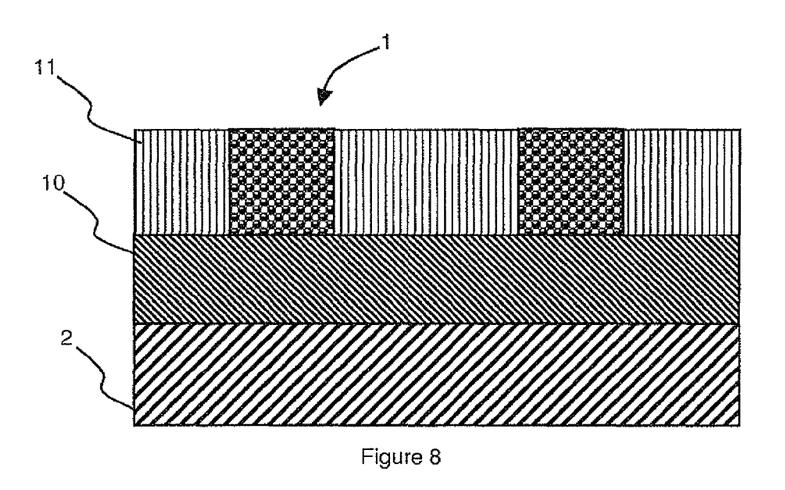
Figure 9:
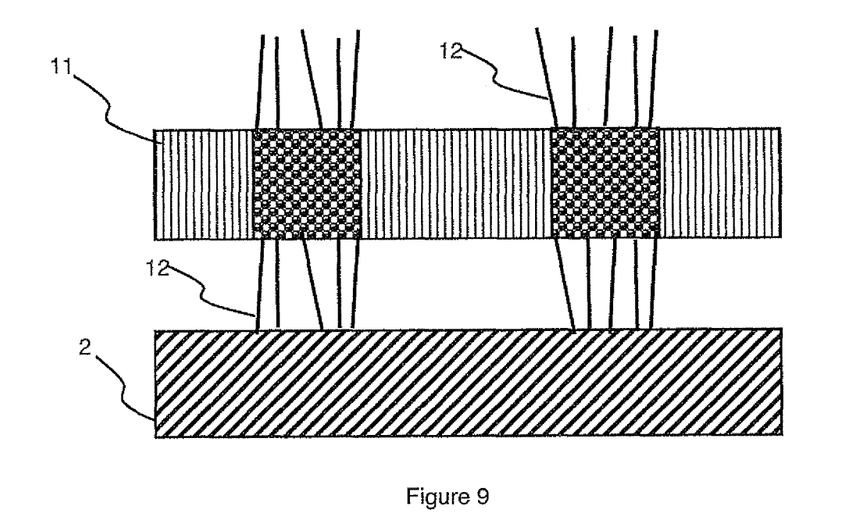

In another alternative embodiment illustrated in FIGS. 8 and 9, first material 10 is disposed between support 2 and second material 11 and can form a continuous layer or patterns. As before, microcavities 1 are formed in second material 11 and the bottom thereof is formed by first material 10. The porous catalyst material is then formed in microcavities 1 (FIG. 8).

Support 2 is subjected to a chemical degradation agent which passes through the porous material and degrades first material 10. First material 10 being at least partially eliminated, air gaps form in first material 10. The latter can also be completely eliminated and second material 11 is then supported by means of suspension structures (not shown). First material 10 can for example be made from silicon oxide and second material 11 from silicon nitride or metal.

Support 2 then undergoes the growth process of nanotubes or nanowires 12. Growth of the latter takes place from the porous catalyst material on the two free surfaces in two opposite directions. A part of the nanotubes or nanowires therefore grows vertically upwards and another part grows downwards in FIG. 9 until it connects support 2. Advantageously, the nanotubes or nanowires connect support 2 in active component electric connection areas (FIG. 9).

As an alternative, the nanotubes or nanowires can also connect metallic material patterns belonging to a lower metallic level of support 2.

Input of material for growth of the nanotubes/wires can be performed by the pores or by another cavity.

It may be advantageous to modulate the size and composition of the particles, for example to reduce the porosity with respect to the case where the particles are all of the same size. The porous material obtained can then present an enhanced strength.

The dielectric constant of the porous material obtained can also be adjusted by choosing the size and composition of the particles which compose same.

It is also possible to form a hydraulic network constituted by nanotubes which have intersections made of porous material. Nanotubes or nanowires can also be used to act as heat conductors to remove heat.

In an alternative embodiment, the recesses are pass-through holes passing through support 2 and form all or part of micropassages 13. Making micropassages from porous material is similar to formation of the porous material in the microcavities.

Figure 10:
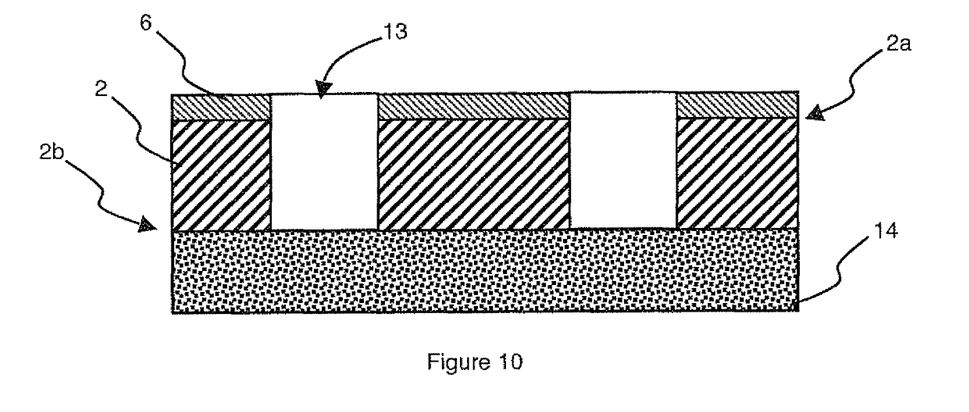

In a particular embodiment illustrated in FIG. 10, a supporting layer 14 is advantageously formed on the opposite surface 2b of the support. Micropassages 13 are then made from main surface 2a until they reach supporting layer 14. During formation of the micropassages, the supporting layer can be partially etched. Micropassages 1 are thus formed in support 2 by the pass-through holes, but they are covered by supporting layer 14. Supporting layer 14 makes for ease of fabrication as it can be easily removed. Layer 14 provides mechanical support but can also act as stop layer in formation of nanotubes or for a polishing step.

Figure 11:
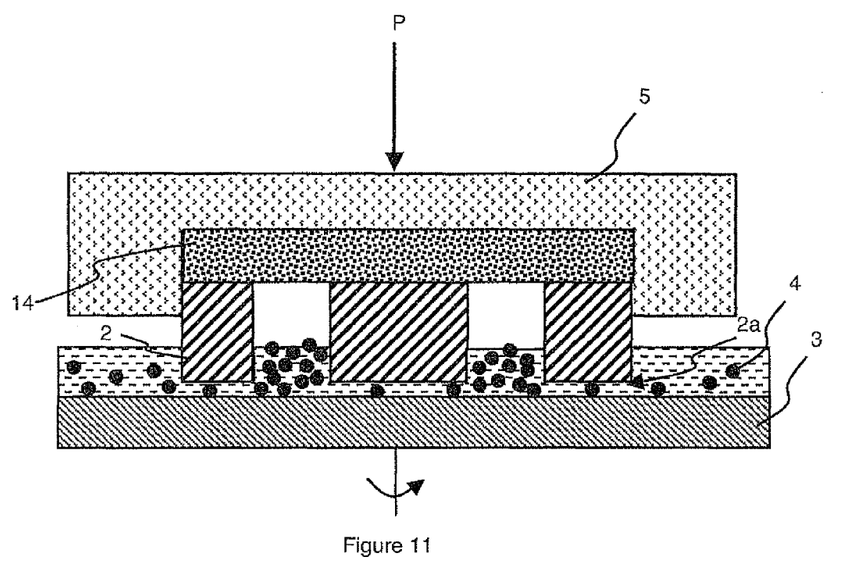

Main surface 2a of the support, which comprises micropassages 13, is then subjected to a chemical mechanical deposition process, which is similar to the chemical mechanical polishing processes. Thus, as illustrated beforehand in FIG. 11, first main surface 2a, onto which micropassages 13 open out is placed in contact with pad 3 covered by the aqueous solution which comprises particles 4. As before, a force is applied on the support in a direction forming a non-zero angle with respect to the plane of the support. This force results in creation of a pressure P between support 2 and pad 3, advantageously perpendicularly to the plane of support 2.

Figure 12:
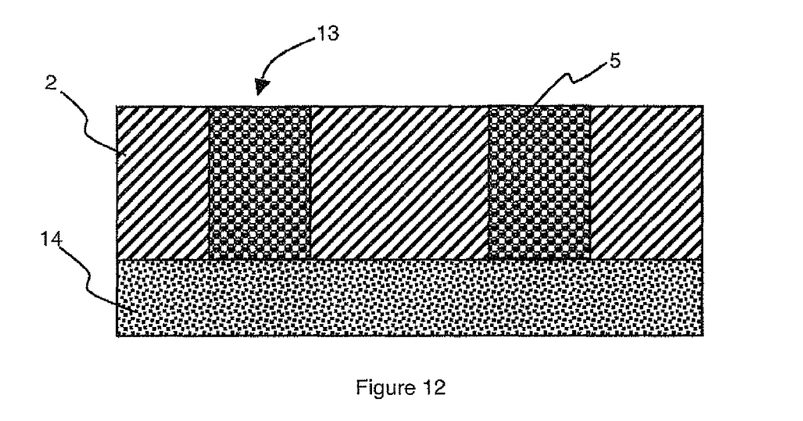

As illustrated in FIG. 12, when chemical mechanical deposition is performed, at least one particle 4 is inserted in each micropassage 13 which was initially void. A porous material is thus formed inside the micropassage. It is constituted by the particle or particles and the void (or gas) which occupies the remaining volume of the micropassage. The porous material can completely or partially fill micropassage 13. The porous material can be comprised of a single particle, but in conventional manner it is formed by a plurality of particles 4. Advantageously, these particles 4 are compressed in the micropassage to thus form patterns of porous material which are mechanically stronger. The porous material is a permeable material. The homogeneous arrangement of the pores in the porous material in fact enables a fluid to flow through the latter.

Chemical mechanical deposition can be performed, as before, by conventional chemical mechanical polishing equipment following the same conditions. The pads used for chemical mechanical deposition are also identical to those used in conventional polishing methods. In conventional manner, the characteristics of the pad depend on the desired application, on the materials located at the surface of the support and on the dimensions of the micropassages to be filled.

The load pressure enables particles 4 to be inserted in micropassages 13 by compressing the latter. By adjusting the value of the load pressure, it is possible to adjust the final porosity of the porous material, i.e. the void proportion in the final material. If supporting layer 14 is not deposited on the support, the bearing head will cover the micropassages at the level of the opposite surface 2b and enable a pressure to be applied on the particles situated in the micropassages.

Particles 4 in suspension in the aqueous solution can be pure or be formed by a core material covered by a coating material. If particles 4 are pure, they are for example made from silica, carbon, cerium oxide, titanium oxide, alumina, polymer material or different metals, for example Fe, Co, Au, Pd, Ni, Pt, Ru, Sn, Mo, ZnO, Ce, etc. If particles 4 are coated, the coating material is for example alumina, cerium oxide or iron oxide. They are for example particles of silica or of polymer materials or compounds coated with alumina or cerium oxide. The use of a coating material enables the zeta potential to be made to vary thereby enabling easy separation of the elementary particles from the colloidal suspension.

The size of elementary particles 4 is advantageously comprised between 3 and 300 nm. Furthermore, the weight percentage of particles 4 in the aqueous solution is advantageously comprised between 0.0001 and 50%. The particles can be spherical or of any shape.

For example purposes, the commercial aqueous solutions Klebosol™ 1508-35 and T605 can be used.

In conventional manner, when chemical mechanical deposition is performed, polishing pad 3 only removes particles 4 of the aqueous solution on the parts in contact with the support, i.e. on the parts of support 2 which border the micropassages and/or in the areas where the porous material overshoots the plane of the support.

However, when chemical mechanical deposition is performed, removal of material can take place on the top parts of the main surface of the support, while the micropassages are filled by the particles of the aqueous solution. Removal of material depends on the process conditions (load pressure, particle material, aqueous solution, and so on) and on the type of material present at the surface of the support.

If the material of support 2 which is in contact with pad 3 is too fragile and can be eliminated during the deposition process, strengthening material 6 is advantageously used (FIG. 1). Strengthening layer 6 is formed on surface 2a and micropassages 13 are etched in support 2 through the strengthening layer.

In an also advantageous manner, the side walls of micropassages 13 are covered by the layer of covering material (not shown), for example by an insulating material for example made from silicon oxide. Although the side walls of micropassage 13 are covered by the covering layer, most of the volume of micropassage 13 is not filled. Furthermore, the covering layer is removed in the bottom of micropassage 13. Typically, the bottom of the layer is etched by plasma as for formation of spacers in the microelectronics field If the material of support 2 is not chemically compatible with the material used for particles 4, the covering material is advantageously used.

The pressure exerted by pad 3 on the particles arranged in the micropassages causes creation of bonds between the particles and also with the walls of the micropassages. When drying takes place, the particles remain chemically or electrostatically bonded to one another and to the walls of the micropassage. The pressure exerted on the particles can also cause sintering of the particles, thereby enhancing the strength of the whole of the micropassage.

The number of particles 4 arranged in micropassage 1 and the size of the pores of the porous material obtained are functions of the dimensions of micropassage 1, of the size of particles 4 and of the pressure exerted on the particles.

To obtain one particle per micropassage, it is advantageous to opt for a particle that has substantially the same dimension as the micropassage. To obtain two particles per micropassage, it is advantageous to choose particles, assumed to be spherical, that have diameters substantially equal to two thirds of the dimension of the micropassage, assumed to be cubical, Thus, to dispose at least two spherical particles in a cavity, the latter have to have a diameter smaller than two thirds of the smallest dimension of the micropassage.

If the membrane is designed to be subjected to a high throughput, it is preferable for the micropassages to be filled with few particles. On the contrary, for a membrane that presents a very high catalytic power efficiency, the exchange surface has to be large and the micropassages are then filled with a very large number of particles. The person skilled in the trade will make a trade-off between these two requirements depending on the scheduled application of the membrane. The documents "High performance nanoporous carbon membranes for air separation", Carbon 45 (2007) 1267-1278 and "Crossflow membrane filtration of interacting nanoparticle suspensions", Journal of Membrane Science 284 (2006) 361-372 describe the influence of the porosity and size of the pores on the selectivity between two mixed gases. These documents also describe the influence of the shape and size of the particles on the characteristics of the membrane. They further describe the influence of the arrangement of the particles on the flux passing through the membranes.

The porous material can be a dielectric material and is then formed by particles 4 made from dielectric material and/or covered by a dielectric material. The particles are for example made from silica, cerium oxide, alumina or polymer material if they are pure. The particles can however also be made from conducting material, for example carbon, iron, cobalt, platinum, nickel, etc covered by a dielectric material. The porous material can also be a catalyst material which allows decomposition reactions of gases or compounds by liquid or gaseous process. Production of a membrane comprising areas made from porous catalyst material is particularly interesting as, the temperature of the process being low, typically lower than 100° C., the particles of catalyst material are kept totally active.

As illustrated in FIG. 12, micropassages 13 filled by the porous material form passages between the two main surfaces 2a and 2b of support 2. In conventional manner, support 2 and supporting layer 14 are made from different materials, however they can also comprise the same constituents in different proportions. Supporting layer 14 is for example made from $Al_2O_3$, $SiO_2$, SiN, SiCN, SIC, SiOC or from polymer material. Supporting layer 14 can also be a metal.

Figure 13:
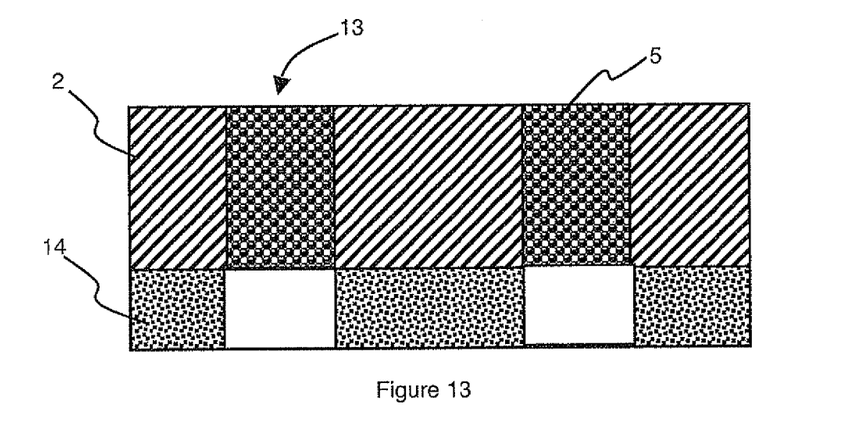

If supporting layer 14 is made from impermeable material, the supporting layer is then removed at least at the level of the passages (FIG. 13), by any suitable technique. This removal of the supporting layer enables a fluid to flow from one of the main surfaces of the membrane, for example surface 2b, to the other surface 2a. Supporting layer 14 can be made for example from silicon oxide and degradation thereof is then performed by means of hydrofluoric acid. The supporting layer presents an etching selectivity with respect to the porous material and support 2.

Figure 14:
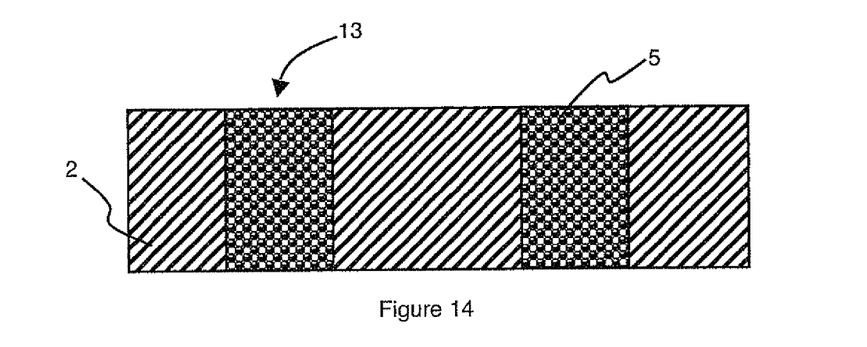

If supporting layer 14 is permeable to the fluid that is to flow through the membrane, it can be left (FIG. 12) or then be removed (FIG. 14) to prevent too great pressure losses at the level of the membrane.

Figure 15:
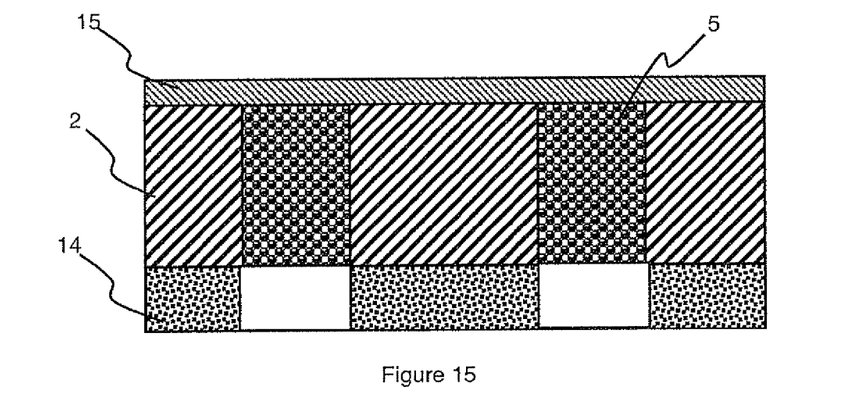

In an alternative embodiment illustrated in FIG. 15, a permeable layer 15 can be formed on at least one surface 2a or 2b of the membrane. This permeable layer 15 is advantageously made from electrically conducting material, however it can also be made from semi-conductor or dielectric material. Even more advantageously, the permeable layer is a layer that enables conduction of protons in the membrane. The permeable layer material is then chosen from nafion®, polybenzimidazoles, sulphonated polyetherethercetones, or sulphonated polyimides. The membrane can advantageously be used in a fuel cell.

In another alternative embodiment (not shown), micropassage 13 can be cleaned to eliminate residues contained in the aqueous solution and which were introduced with particles 4. The micropassages are then rinsed by means of a chemical solution which can be a mixture of water, hydrofluoric acid, sulphuric acid, hydrochloric acid and/or hydrogen peroxide. It is also possible to clean the passage by means of heat treatment under oxygen at a temperature of more than 200° C., or to use a remote oxygen plasma.

Figure 16:
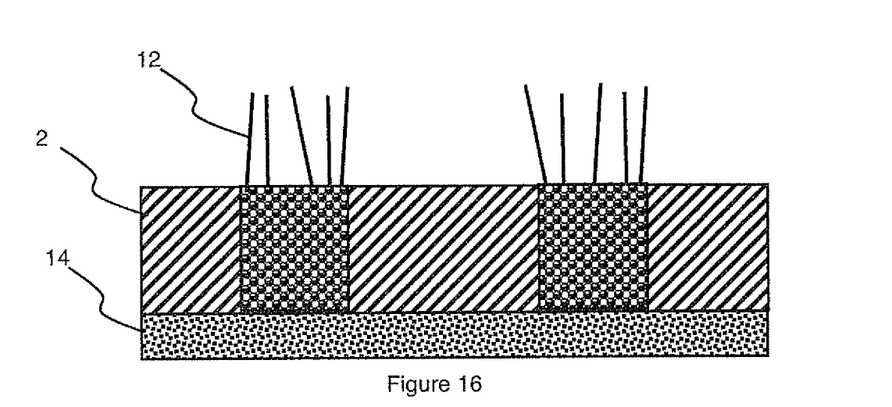
Figure 17:
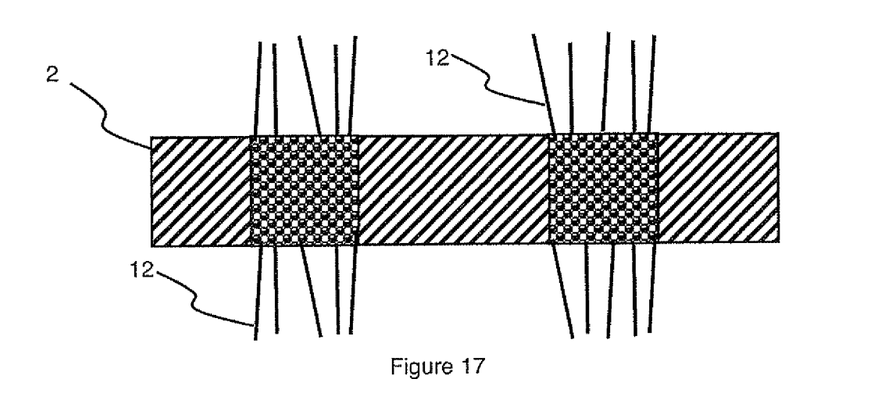

The porous material formed in micropassages 13 can also be used as catalyst material to localize growth of nanotubes or nanowires 12, as illustrated in FIGS. 16 and 17. In this case, support 2 comprising micropassages 13 filled by the porous catalyst material is subjected to a nanotube or nanowire growth process. The nanowires or nanotubes can be electrically conducting or not. Nanoparticles, for example Pt or Ru, can be grafted on the nanotubes. This application is particularly interesting for methanol oxidation membranes in fuel cells. Increasing the contact surface enables the flux to be slowed down around the micropassages thereby increasing the efficiency of the membrane. The density of nanotubes or nanowires depends directly on the density and size of the particles.

If supporting layer 14 is present during the nanotube or nanowire growth process, growth of the latter takes place from the free surface in a substantially vertical direction with respect to the plane of support 2. If the supporting layer is eliminated before growth, the nanotubes or nanowires grow from the two free surfaces, i.e. on each main surface of the membrane.

Modulating the chemical composition of the particles enables plurispecific membranes to be produced, i.e. membranes that are able to catalyze several species mixed in an initial composition. Modulating the size of the particles (even if the latter have the same chemical composition) enables the reactivity of the particles to be varied. Modulating the size of the particles enables a wide surface energy range to be obtained and provides a wide range of reactivity through one and the same micropassage. The exceptional reactivity of the nanoparticles is in fact linked to the fact that they comprise a high ratio between the surface atoms which have free atomic bonds and the atoms of volumes which do not have any free bonds. The reactivity increases when the number of free bonds increases. It is thereby possible to catalyze a given species with a great probability by using a wide range of nanoparticle sizes.

A membrane can thus be formed, the membrane being constituted by an impermeable support which comprises pass-through passages, these pass-through passages being filled by a porous material.

The invention claimed is:

1. A method for forming a nanotube or a nanowire in a microcavity or a micropassage of a support, said microcavity or said micropassage opening out onto a surface of the support, comprising:
    providing the support so that the surface of the support is in contact with an aqueous solution comprising a plurality of particles of catalyst material in suspension;
    applying a pressure on the support, between a polishing pad and the surface of the support, and a relative movement of the pad and of said surface of the support to insert at least one particle in the microcavity or the micropassage to form the porous catalyst material; and
    growing a nanotube or a nanowire from the porous catalyst material;
    wherein the particles of catalyst material are selected from the group consisting of Fe, Co, Ni and Au.

2. The method according to claim 1, wherein a plurality of particles having different chemical composition are in suspension in the aqueous suspension.

3. The method according to claim 1, wherein a plurality of particles having different size are in suspension in the aqueous suspension so as to form nanotubes or nanowires with different surface energy.

4. The method according to claim 1, wherein porosity of the porous catalyst material in the microcavity or the micropassage is in the range of from 26% to 50%.

5. The method according to claim 1, wherein at least two particles are inserted into the microcavity or the micropassage of the support, the at least two particles being spherical and having a diameter smaller than two thirds of a smallest dimension of the microcavity or the micropassage.

6. The method according to claim 1, wherein diameter of the particles is in the range of from 3 to 300 nm.

7. The method according to claim 1, wherein weight percentage of the particles in the aqueous solution is in the range of from 0.0001 to 50%.

8. The method according to claim 1, wherein the pressure exerted is in the range of from 0.02 daN/cm$^2$ to 1 daN/cm$^2$.

9. The method according to claim 1, wherein a strengthening layer is deposited on said surface of the support before formation of said microcavities.

10. The method according to the claim 9, wherein the strengthening layer is made from silicon nitride.

11. The method according to claim 1, wherein a covering layer covers inner walls of the microcavity or of the micropassage.

* * * * *